US012564105B2

(12) United States Patent
Ryu et al.

(10) Patent No.: US 12,564,105 B2
(45) Date of Patent: Feb. 24, 2026

(54) SEMICONDUCTOR PACKAGE

(71) Applicant: Samsung Electronics Co., Ltd.,
Suwon-si (KR)

(72) Inventors: Seunggeol Ryu, Suwon-si (KR);
Taehwan Kim, Suwon-si (KR);
Shle-Ge Lee, Suwon-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 295 days.

(21) Appl. No.: 18/238,099

(22) Filed: Aug. 25, 2023

(65) Prior Publication Data

US 2024/0222348 A1     Jul. 4, 2024

(30) Foreign Application Priority Data

Jan. 4, 2023     (KR) ........................ 10-2023-0001423

(51) Int. Cl.
H01L 23/48          (2006.01)
H01L 23/00          (2006.01)
(Continued)

(52) U.S. Cl.
CPC .......... H01L 25/18 (2013.01); H01L 23/3128
(2013.01); H01L 23/5385 (2013.01);
(Continued)

(58) Field of Classification Search
CPC . H01L 25/18; H01L 23/3128; H01L 23/5385;
H01L 24/48; H01L 25/0652; H01L
2224/48091; H01L 2224/48227; H01L
2924/15311; H01L 23/49816; H01L 24/16; H01L 25/0657; H01L 2224/73204;
H01L 2224/12105; H01L 2225/1058;
H01L 24/13; H01L 2224/0401; H01L
24/81;
(Continued)

(56) References Cited

U.S. PATENT DOCUMENTS 7,276,790 B2     10/2007     Seng
7,855,443 B2     12/2010     Tsai et al.
(Continued)

FOREIGN PATENT DOCUMENTS

JP          H07263449 A  *  10/1995  ............. H01L 24/14
KR          101476883 B1     12/2014

*Primary Examiner* — Niki H Nguyen
(74) *Attorney, Agent, or Firm* — Muir Patent Law, PLLC

(57)          ABSTRACT

A semiconductor package may include a first package
including a first substrate, a first semiconductor chip
mounted on the first substrate, and a second substrate on the
first semiconductor chip, the first package having a center
region, a first edge region surrounding the center region, and
a second edge region surrounding the first edge region in a
plan view, dummy balls disposed on the center region and
the second edge region of the first package, connection
terminals disposed on the first edge region of the first
package, and a second package including a third substrate
disposed on the dummy balls and the connection terminals
and a second semiconductor chip mounted on the third
substrate. The dummy balls may be in contact with the
second substrate and may be spaced apart from the third
substrate, and the connection terminals may be coupled to
the second and third substrates.

20 Claims, 9 Drawing Sheets

(51) Int. Cl.

| | |
|---|---|
| *H01L 23/31* | (2006.01) |
| *H01L 23/52* | (2006.01) |
| *H01L 23/538* | (2006.01) |
| *H01L 25/065* | (2023.01) |
| *H01L 25/18* | (2023.01) |
| *H01L 29/40* | (2006.01) |
| *H10B 80/00* | (2023.01) |

(52) U.S. Cl.

CPC .......... *H01L 24/48* (2013.01); *H01L 25/0652* (2013.01); *H10B 80/00* (2023.02); *H01L 2224/48091* (2013.01); *H01L 2224/48227* (2013.01)

(58) Field of Classification Search

CPC ........... H01L 24/19; H01L 2225/06517; H01L 24/05; H01L 2225/06513; H01L 24/17; H01L 2224/16145; H01L 2224/32145; H01L 2924/014; H01L 2224/73253; H01L 2224/04105; H01L 23/5226; H01L 2224/1703; H01L 21/563; H01L 2224/16238; H01L 2224/16146; H01L 2224/17517; H01L 2924/15331; H01L 2225/06562; H01L 24/08; H01L 2224/48145; H01L 2224/16237; H01L 2224/81192; H01L 2224/08145; H01L 2224/13025; H01L 24/10; H01L 24/97; H01L 2224/06515; H01L 2224/16235; H01L 2224/17051; H01L 2224/19; H01L 2224/49113; H01L 2224/81203; H01L 23/488; H01L 2224/02371; H01L 2224/0603; H01L 2224/13022; H01L 2224/73207; H01L 2224/48465; H01L 2224/023; H10B 80/00

See application file for complete search history.

(56) References Cited

U.S. PATENT DOCUMENTS

| | | | |
|---|---|---|---|
| 8,399,992 B2 | 3/2013 | Park et al. | |
| 9,502,360 B2 | 11/2016 | Lin et al. | |
| 9,793,246 B1 | 10/2017 | Tseng et al. | |
| 9,985,008 B2 | 5/2018 | Shi et al. | |
| 10,211,182 B2 | 2/2019 | Meyer et al. | |
| 10,276,548 B2 | 4/2019 | Chen et al. | |
| 10,541,201 B2* | 1/2020 | Lee | ...................... H01L 24/81 |
| 2012/0306102 A1* | 12/2012 | Cho | .................. H01L 23/3128 |
| | | | 257/E23.116 |
| 2018/0294216 A1* | 10/2018 | Kim | ..................... H01L 25/50 |
| 2022/0328389 A1* | 10/2022 | Hwang | ............. H01L 23/3128 |
| 2023/0402358 A1* | 12/2023 | Yim | ................ H01L 23/49816 |
| 2024/0321759 A1* | 9/2024 | Wang | .............. H01L 23/49833 |

* cited by examiner

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0001423, filed on Jan. 4, 2023, in the Korean Intellectual Property Office, the entire contents of which are hereby incorporated by reference.

BACKGROUND OF THE INVENTION

The present disclosure relates to a semiconductor package, and in particular, to stacked semiconductor packages.

A semiconductor package may be a form of an integrated-circuit chip used as a part of an electronic product. In general, the semiconductor package includes a printed circuit board (PCB) and a semiconductor chip, which is mounted on the PCB and is electrically connected to the PCB using bonding wires or bumps. With development of the electronic industry, various studies are being conducted to realize a highly-reliable, highly-integrated, and small-sized semiconductor package. For example, technologies of stacking multiple semiconductor chips on a single substrate or stacking a semiconductor package on another semiconductor package have been suggested. Such technologies may include a package-on-package (POP) technology of vertically stacking semiconductor chips to realize a high-density chip stacking structure. According to the POP technology, it is possible to integrate various semiconductor chips within an area which is smaller than a packaging structure composed of a single semiconductor chip.

SUMMARY

An embodiment of the inventive concept provides a semiconductor package with improved structural stability.

An embodiment of the inventive concept provides a semiconductor package with improved thermal stability.

According to an embodiment of the inventive concept, a semiconductor package may include a first package including a first substrate, a first semiconductor chip mounted on the first substrate, and a second substrate on the first semiconductor chip, the first package having a center region, a first edge region surrounding the center region, and a second edge region surrounding the first edge region, when viewed in a plan view, dummy balls disposed on the center region and the second edge region of the first package, substrate connection terminals disposed on the first edge region of the first package, and a second package including a third substrate, which is disposed on the dummy balls and the substrate connection terminals, and a second semiconductor chip, which is mounted on the third substrate. The dummy balls may be in contact with the second substrate and may be spaced apart from the third substrate, and the substrate connection terminals may be coupled to the second substrate and the third substrate.

According to an embodiment of the inventive concept, a semiconductor package may include a first substrate, a first semiconductor chip mounted on the first substrate, a second substrate disposed on the first semiconductor chip, a connection structure spaced apart from the first semiconductor chip and connecting the first substrate to the second substrate, a third substrate disposed on the second substrate, and a second semiconductor chip mounted on the third substrate. The second substrate may include a first region, on which connection terminals connecting the second substrate to the third substrate are provided, a second region surrounded by the first region and provided with first dummy balls, and a third region surrounding the first region and provided with second dummy balls. A first contact area between each of the first and second dummy balls and the third substrate, may be smaller than a second contact area between each of the connection terminals and the third substrate.

According to an embodiment of the inventive concept, a semiconductor package may include a first package having a center region, a first edge region surrounding the center region, and a second edge region surrounding the first edge region, when viewed in a plan view, dummy balls disposed on the center region and the second edge region of the first package, connection terminals disposed on the first edge region of the first package, and a second package on the dummy balls and the connection terminal. The first package may include a first substrate, a first semiconductor chip mounted on the first substrate, a second substrate on the first semiconductor chip, a connection structure spaced apart from the first semiconductor chip and connecting the first substrate to the second substrate, and a first mold layer provided between the first and second substrates and enclosing the first semiconductor chip and the connection structure. The second package may include a third substrate, a second semiconductor chip wire-bonded to the third substrate, and a second mold layer enclosing the second semiconductor chip on the third substrate. The connection terminals may connect the second substrate to the third substrate, and a first contact area between each of the dummy balls and the third substrate, may be smaller than a second contact area between each of the connection terminals and the third substrate.

DETAILED DESCRIPTION

Example embodiments of the inventive concepts will now be described more fully with reference to the accompanying drawings, in which example embodiments are shown.

Figure 1:
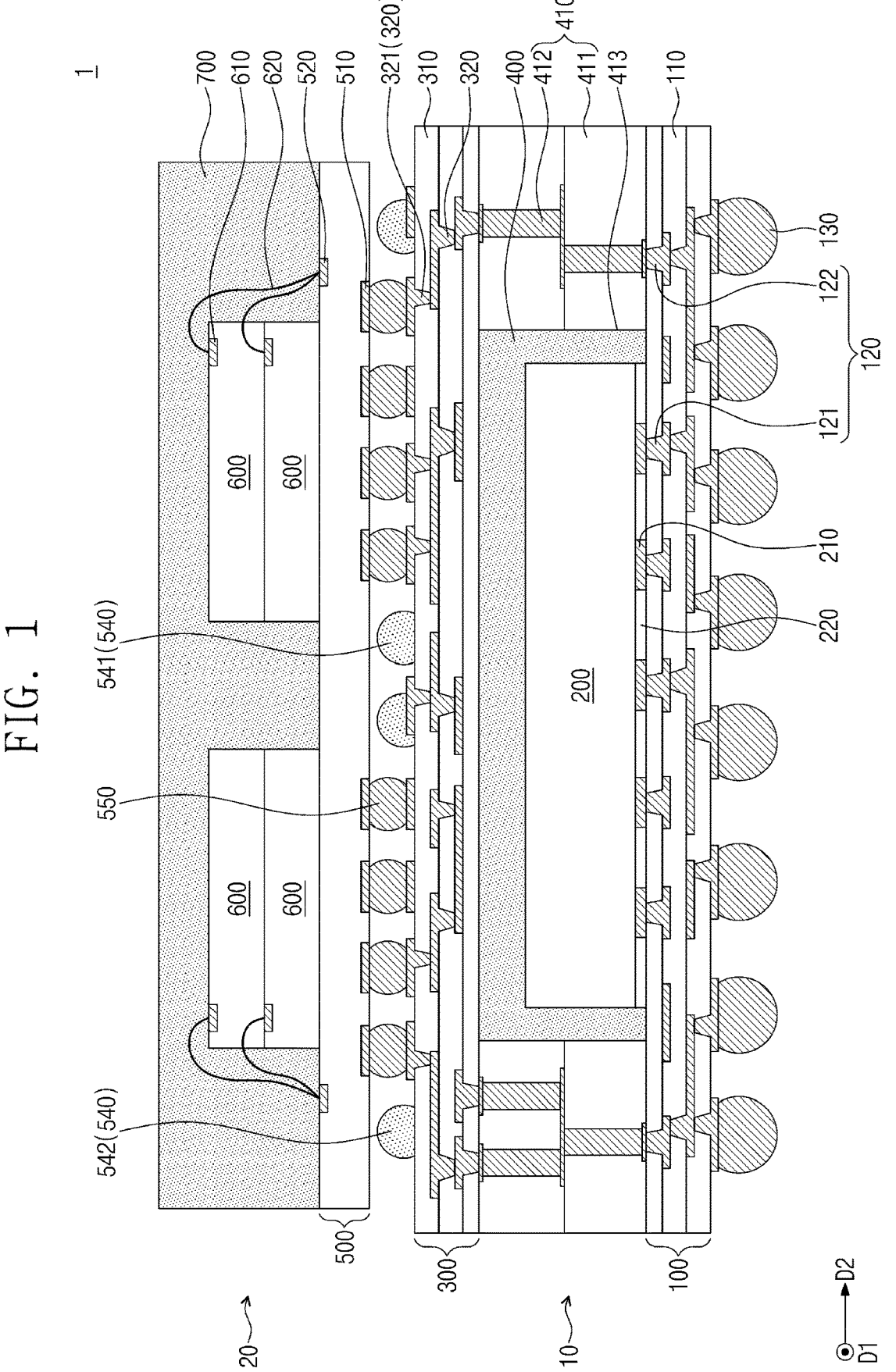
FIG. 1 is a sectional view illustrating a semiconductor package according to an embodiment of the inventive concept.
Figure 2:
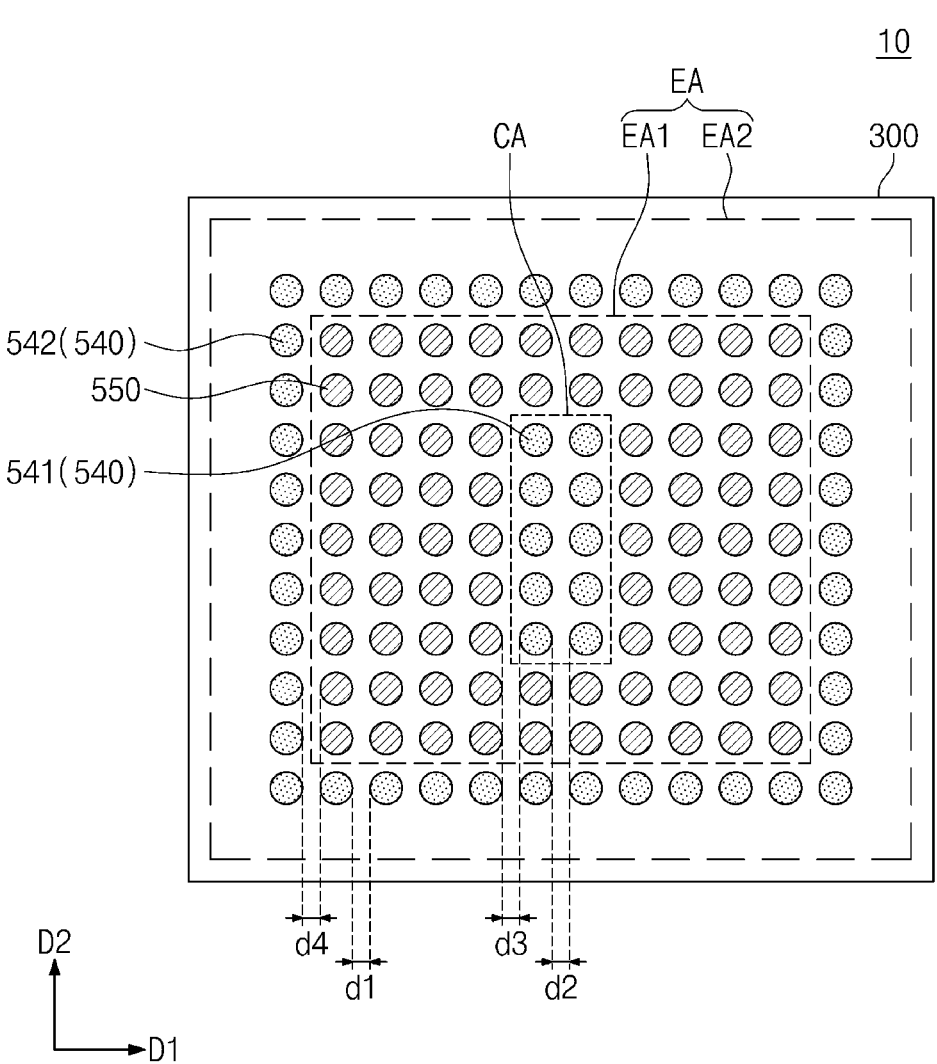
FIG. 2 is a plan view illustrating a semiconductor package according to an embodiment of the inventive concept.

FIG. 1 is a sectional view illustrating a semiconductor package according to an embodiment of the inventive concept. FIG. 2 is a plan view illustrating a semiconductor package according to an embodiment of the inventive concept.

Referring to FIGS. 1 and 2, a semiconductor package 1 may include a first semiconductor package 10 and a second semiconductor package 20.

The first semiconductor package 10 may include a first substrate 100, a first semiconductor chip 200, a second substrate 300, a first mold layer 400, and a connection substrate 410. In the present specification, a first direction D1 and a second direction D2 may be two different directions, which are parallel to a top surface of the first substrate 100 and are perpendicular to each other.

The first substrate 100 may be a redistribution substrate. For example, the redistribution substrate may include first insulating layers 110 and first interconnection patterns 120 in the first insulating layers 110. In an embodiment, the first substrate 100 may be a printed circuit board. For example, the printed circuit board may include a core layer and interconnection patterns, which are printed on top and bottom surfaces of the core layer. The following description will be given based on the embodiment of FIG. 1.

The first substrate 100 may include a plurality of first insulating layers 110, which are sequentially stacked. FIG. 1 illustrates an example in which three first insulating layers 110 are provided in the first substrate 100, but the inventive concept is not limited to this example. The number of the first insulating layers 110 provided in the first substrate 100 may be variously changed, if necessary. The first insulating layers 110 may include or may be formed of a photoimageable dielectric (PID) material. The PID material may be at least one of polymers. The PID material may include at least one of photoimageable polyimide, polybenzoxazole, phenol-based polymers, and benzocyclobutene-based polymers. Interfaces between the first insulating layers 110 are illustrated in FIG. 1, but the inventive concept is not limited to this example. For example, adjacent ones of the first insulating layers 110 may be provided such that no observable interface is present.

The first interconnection patterns 120 may be provided in the first insulating layers 110. The uppermost one of the first interconnection patterns 120 may be exposed to the outside of the first substrate 100, near the top surface of the first substrate 100. The lowermost one of the first interconnection patterns 120 may be exposed to the outside of the first substrate 100, near a bottom surface of the first substrate 100.

Each of the first interconnection patterns 120 may have a first via portion and a first wire portion, which are connected to form a single object. The first wire portion may be an interconnection pattern, which is provided in the first substrate 100 and is used for a horizontal interconnection. The first via portion may be an interconnection pattern, which is provided in the first insulating layer 110 and is used for a vertical interconnection. The first via portion may connect the first interconnection pattern 120 to one another, which is vertically adjacent thereto, in a vertical direction. As a distance to the top surface of the first substrate 100 decreases, a width of the first via portion may decrease. The first via portion may be provided on the first wire portion. The first wire portion may be connected to the first via portion, without an interface therebetween. A width of the first wire portion may be larger than the width of the first via portion. In other words, each of the first interconnection patterns 120 may have a section shaped like an inverted letter "T". The first via portion of the first interconnection patterns 120 may be disposed on a top surface of the first insulating layer 110. The first via portion of one of the first interconnection patterns 120 may be coupled to the first wire portion of another of the first interconnection patterns 120 placed thereon. In the present specification, the expression "electrically connected or coupled" may mean that a plurality of elements are directly connected/coupled to each other or are indirectly connected or coupled to each other via another conductive element. The first interconnection patterns 120 may include or may be formed of a conductive material. For example, the first interconnection patterns 120 may be formed of or include copper (Cu).

Although not shown, the first interconnection patterns 120 may further include seed patterns provided on top surfaces thereof. The seed patterns may cover top and side surfaces of the first via portion and a top surface of the first wire portion of the first interconnection patterns 120. The seed patterns may be formed of or include a material different from the first interconnection patterns 120. The seed patterns may serve as a barrier layer preventing a material in the first interconnection patterns 120 from being diffused. The seed patterns may include or may be formed of a conductive material. For example, the seed patterns may be formed of or include at least one of copper (Cu), titanium (Ti), gold (Au), silver (Ag), and an alloy thereof.

Outer connection terminals 130 may be disposed on bottom surfaces of the lowermost ones of the first interconnection patterns 120. The lowermost ones of the first interconnection patterns 120 may be used as pads, on which the outer connection terminals 130 are disposed. The outer connection terminals 130 may include or may be solder balls or solder bumps. The outer connection terminals 130 may be formed of or include at least one of, for example, tin (Sn), bismuth (Bi), lead (Pb), silver (Ag), and an alloy thereof.

The first semiconductor chip 200 may be provided on the first substrate 100. In an embodiment, the first semiconductor chip 200 may be a logic chip or a buffer chip. The logic chip may include an application specific integrated circuit (ASIC) chip or an application processor (AP) chip. Alternatively, the logic chip may include a central processing unit (CPU) or a graphics processing unit (GPU). The ASIC chip may include an application specific integrated circuit (ASIC). In an embodiment, the first semiconductor chip 200 may be a memory chip.

The first semiconductor chip 200 may include first chip pads 210, which are provided on a bottom surface of the first semiconductor chip 200. The first chip pads 210 may be electrically connected to an integrated circuit, which is formed in the first semiconductor chip 200. The first chip pads 210 may be exposed to the outside of the first semiconductor chip 200, near the bottom surface of the first semiconductor chip 200. The first chip pads 210 may include or may be formed of a conductive material. For example, the first chip pads 210 may be formed of or include copper (Cu).

A first chip passivation layer 220 may be provided on the bottom surface of the first semiconductor chip 200. The first chip passivation layer 220 may enclose the first chip pads 210. The first chip passivation layer 220 may expose bottom surfaces of the first chip pads 210. A bottom surface of the first chip passivation layer 220 may be substantially coplanar with the bottom surfaces of the first chip pads 210. The first chip passivation layer 220 may be formed of or include at least one of insulating materials (e.g., silicon oxide (SiO), silicon nitride (SiN), and silicon carbon nitride (SiCN)). Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The first semiconductor chip 200 may be disposed on the first substrate 100 in a face-down manner. For example, the first semiconductor chip 200 may have a front surface, which faces the first substrate 100, and a rear surface, which is opposite to the front surface. In the present specification, the front surface may be defined as a surface of a semiconductor chip, which is adjacent to an active surface of a semiconductor substrate. At the active surface, integrated elements are formed. Pads of the semiconductor chip are formed on the active surface. The rear surface may be a surface of the semiconductor chip opposite to the front surface. In other words, the bottom surface of the first semiconductor chip 200, on which first chip pads 230 are disposed, may correspond to the front surface of the first semiconductor chip 200, and a top surface of the first semiconductor chip 200 may correspond to the rear surface of the first semiconductor chip 200. For example, the first semiconductor chip 200 may be disposed such that the front surface thereof faces the first substrate 100. The first semiconductor chip 200 may be mounted on the first substrate 100. For example, the first semiconductor chip 200 and the first substrate 100 may contact with each other, as shown in FIG. 1. Here, the first chip passivation layer 220 may be in contact with the uppermost one of the first insulating layers 110 of the first substrate 100, and the first chip pads 210 may be connected to first interconnection patterns 121. The term "contact," as used herein, refers to a direct connection (i.e., physical touching) unless the context indicates otherwise.

The connection substrate 410 may be disposed on the first substrate 100. The connection substrate 410 may surround the first semiconductor chip 200. For example, the connection substrate 410 may surround a sidewall of the first semiconductor chip 200. In some embodiments, a portion of the connection substrate 410 may not be present in a space between the bottom surface of the first semiconductor chip 200 and the upper surface of the first substrate 100. The connection substrate 410 may be spaced apart from the first semiconductor chip 200. The connection substrate 410 may have a connection substrate opening 413, which is formed to vertically penetrate the connection substrate 410. The first semiconductor chip 200 may be accommodated in the connection substrate opening 413. The connection substrate opening 413 may have the shape of an open hole connecting top and bottom surfaces of the connection substrate 410. A side surface of the connection substrate 410 may be vertically aligned to a side surface of the first substrate 100. The first semiconductor chip 200 may be disposed on the first substrate 100 and in the connection substrate opening 413 of the connection substrate 410. A bottom surface of the connection substrate 410 may be in contact with the top surface of the first substrate 100. A top surface of the connection substrate 410 may be in contact with a bottom surface of the second substrate 300, which will be described below. The connection substrate 410 may be used as a connection structure connecting the first substrate 100 to the second substrate 300.

The connection substrate 410 may include an insulating pattern 411 and conductive patterns 412. The conductive patterns 412 may be provided in the insulating pattern 411. The conductive patterns 412 may be provided between the connection substrate opening 413 and a side surface of the connection substrate 410. The conductive patterns 412 may be spaced apart from the connection substrate opening 413. The conductive patterns 412 may vertically penetrate the insulating pattern 411 and may be connected to first interconnection patterns 122.

The first mold layer 400 may be provided on the first substrate 100 and in the connection substrate opening 413. The first mold layer 400 may cover the top surface of the first substrate 100 and enclose the first semiconductor chip 200. A top surface of the first mold layer 400 may be coplanar with a top surface of the connection substrate 410. The first mold layer 400 may be formed of or include an insulating polymer (e.g., epoxy molding compound).

The second substrate 300 may be provided on the connection substrate 410 and the first mold layer 400. The second substrate 300 may include a center region CA and an edge region EA, which surrounds the center region CA, when viewed in a plan view. The center region CA may be placed over the first semiconductor chip 200. The center region CA may vertically overlap a portion of the first semiconductor chip 200. When viewed in the first and second direction D1 and D2, a width of the center region CA may be smaller than a width of the first semiconductor chip 200. In other words, when viewed in a plan view, the center region CA may be placed within a perimeter of the first semiconductor chip 200. The edge region EA may include a first edge region EA1 surrounding the center region CA and a second edge region EA2 surrounding the first edge region EA1. In other words, the first edge region EA1 may be located between the center region CA and the second edge region EA2.

The second substrate 300 may be a redistribution substrate. For example, the redistribution substrate may include second insulating layers 310 and second interconnection patterns 320 in the second insulating layers 310.

The second substrate 300 may include a plurality of second insulating layers 310, which are stacked on top of one another. FIG. 1 illustrates an example in which three second insulating layers 310 are provided in the second substrate 300, but the inventive concept is not limited to this example. The number of the second insulating layers 310, which are provided in the second substrate 300 may be variously changed, if necessary. The second insulating layers 310 may be formed of or include a photoimageable dielectric (PID) material. The PID material may include polymer. For example, the PID material may include at least one of photoimageable polyimide, polybenzoxazole, phenol-based polymers, and benzocyclobutene-based polymers. Interfaces between the second insulating layers 310 are illustrated in FIG. 1, but the inventive concept is not limited to this example. For example, adjacent ones of the second insulating layers 310 may be provided such that no observable interface therebetween is present.

The second interconnection patterns 320 may be provided in the second insulating layers 310. Second interconnection patterns 321, which are the uppermost ones of the second interconnection patterns 320, may be exposed to the outside of the second substrate 300, near a top surface of the second substrate 300. The lowermost ones of the second interconnection patterns 320 may be exposed to the outside of the second substrate 300, near the bottom surface of the second substrate 300. The lowermost ones of the second interconnection patterns 320 may be coupled to the conductive patterns 412 of the connection substrate 410.

Each of the second interconnection patterns 320 may have a second via portion and a second wire portion, which are connected to form a single object. The second wire portion may be an interconnection pattern, which is provided in the second substrate 300 and is used for a horizontal interconnection. The second via portion may be an interconnection pattern, which is provided in the second insulating layer 310 and is used for a vertical interconnection. The second via portion may connect the second interconnection pattern 320 to one another, which is vertically adjacent thereto, in a vertical direction. The second wire portion may be provided on the second via portion. The second wire portion may be connected to the second via portion, without an interface therebetween. A width of the second wire portion may be larger than a width of the second via portion. In other words, each of the second interconnection patterns 320 may have a T-shaped section. The second wire portion of the second interconnection pattern 320 may be located on a top surface of the second insulating layer 310. The second via portion of the second interconnection pattern 320 may penetrate the second insulating layer 310 and may be coupled to the second wire portion of an underlying one of the second interconnection pattern 320. The second interconnection patterns 320 may include or may be formed of a conductive material. For example, the second interconnection patterns 320 may be formed of or include copper (Cu).

Although not shown, seed patterns may be disposed on bottom surfaces of the second interconnection patterns 320, respectively. For example, the seed pattern may cover bottom and side surfaces of the second via portion of the second interconnection pattern 320 and a bottom surface of the second wire portion of the second interconnection pattern 320. The seed patterns may be formed of or include a material different from the second interconnection patterns 320.

The seed patterns may serve as a barrier layer preventing a material in the second interconnection pattern 320 from being diffused. The seed patterns may include or may be formed of a conductive material. For example, the seed patterns may be formed of or include at least one of copper (Cu), titanium (Ti), gold (Au), silver (Ag), and an alloy thereof.

The second semiconductor package 20 may be provided on the first semiconductor package 10. The second semiconductor package 20 may include a third substrate 500, second semiconductor chips 600, and a second mold layer 700.

The third substrate 500 may be a redistribution substrate, in which insulating and interconnection layers are alternately stacked on top of another. For example, the redistribution substrate may include insulating layers and interconnection patterns in the insulating layers. Alternatively, the third substrate 500 may be a printed circuit board with a signal pattern. For example, the printed circuit board may include a core layer and interconnection patterns, which are printed on top and bottom surfaces of the core layer.

First substrate pads 520 may be disposed near a top surface of the third substrate 500. The first substrate pads 520 may be exposed to the outside of the third substrate 500, near the top surface of the third substrate 500. Second substrate pads 510 may be disposed near a bottom surface of the third substrate 500. The second substrate pads 510 may be exposed to the outside of the third substrate 500, near the bottom surface of the third substrate 500. The first substrate pads 520 and the second substrate pads 510 may be electrically connected to each other through wires, which are provided in the third substrate 500.

The second semiconductor chips 600 may be provided on the third substrate 500. The second semiconductor chips 600 may include a memory chip. Each second semiconductor chip 600 may include second chip pads 610, which are provided near a top surface thereof. The second chip pads 610 may be electrically connected to an integrated circuit, which is formed in the second semiconductor chips 600. The second chip pads 610 may be exposed to the outside of each of the second semiconductor chips 600, near the top surface of the second semiconductor chip 600. The second chip pads 610 may include or may be formed of a conductive material. In an embodiment, the second chip pads 610 may be formed of or include copper (Cu).

The second semiconductor chips 600 may be stacked on the third substrate 500 to constitute a chip stack. In an embodiment, a plurality of chip stacks may be provided on the third substrate 500. Unlike the illustrated structure, the chip stack may include three or more second semiconductor chips, which are sequentially stacked. The chips of the chip stack may be stacked in a stepwise manner. In addition, three or more chip stacks may be provided on the third substrate 500. Alternatively, one second semiconductor chip 600 may be provided on the third substrate 500 or a plurality of second semiconductor chips 600, which are horizontally spaced apart from each other, may be provided on the third substrate 500.

Each of the second semiconductor chips 600 may be mounted on the third substrate 500 in a wire bonding manner. Bonding wires 620, which connects the first substrate pads 520 to the second chip pads 610, may be provided on the third substrate 500. The bonding wire 620 may include or may be formed of a conductive material.

The second mold layer 700 may be provided on the third substrate 500. The second mold layer 700 may cover not only the top surface of the third substrate 500 but also the second semiconductor chips 600 and the bonding wire 620. The second mold layer 700 may be formed of or include at least one of insulating polymers (e.g., epoxy-based molding compounds).

Dummy balls 540 and substrate connection terminals 550 may be provided in a space between the first and second semiconductor packages 10 and 20. For example, the dummy balls 540 and the substrate connection terminals 550 may be disposed in a space between a top surface of the first semiconductor package 10 and a bottom surface of the second semiconductor package 20. The dummy balls 540 and the substrate connection terminals 550 may be provided on the top surface of the second substrate 300. As used herein, the term "dummy" is used to refer to a component that has the same or similar structure and shape as other components but does not have a substantial function and exists only as a pattern in the device.

The substrate connection terminals 550 may be disposed on the second substrate 300 and in the first edge region EA1. The substrate connection terminals 550 may be spaced apart from each other. The substrate connection terminals 550 may be arranged in the first and second direction D1 and D2, on the second substrate 300. The substrate connection terminals 550 may be arranged such that two adjacent ones of them are spaced apart from each other by a first distance d1. The first distance d1 may be a distance between outer surfaces of two adjacent substrate connection terminals 550. The first distance d1 may be measured in the first direction D1. The first distance d1 of the first direction D1 may be the same as a first distance between two adjacent substrate connection terminals 550 that are arranged in the second direction D2. The present invention is not limited thereto. In some embodiments, the first distance d1 of the first direction D1 may be different from the first distance of the second direction D2. The substrate connection terminals 550 may connect the second substrate 300 to the third substrate 500. That is, the first edge region EA1 may correspond to a mounting region, in which elements for electric connection between the first and second semiconductor packages 10 and 20 are provided. The substrate connection terminals 550 may be coupled to the second interconnection patterns 321, which are exposed to the outside of the second substrate 300, and the second substrate pads 510, which are provided on the bottom surface of the third substrate 500. The substrate connection terminals 550 may electrically connect the first semiconductor chip 200 to the second semiconductor chips 600. The substrate connection terminals 550 may include or may be solder balls or solder bumps. The substrate connection terminals 550 may be formed of or include at least one of, for example, tin (Sn), bismuth (Bi), lead (Pb), silver (Ag), and an alloy thereof.

The dummy balls 540 may be disposed on the second substrate 300 and in the center region CA and the second edge region EA2. The dummy balls 540 may be spaced apart from each other. Each of the dummy balls 540 may have a structure whose a width increases and then decreases in a direction from its bottom surface toward the third substrate 500. Alternatively, each of the dummy balls 540 may have a structure whose width decreases in a direction toward the third substrate 500. A width of a bottom surface of each dummy ball 540 may be larger than a width of the topmost end of each dummy ball 540 adjacent to the third substrate 500. Each dummy ball 540 may have its smallest width at the topmost end. Each of the dummy balls 540 may be substantially the same planar area as the substrate connection terminals 550, but the inventive concept is not limited to this example. The dummy balls 540 may include or may be solder balls or solder bumps. The dummy balls 540 may be formed of or include at least one of, for example, tin (Sn), bismuth (Bi), lead (Pb), silver (Ag), and an alloy thereof.

The dummy balls 540 may include first dummy balls 541, which are provided on the center region CA of the second substrate 300, and second dummy balls 542, which are provided on the second edge region EA2. When viewed in a plan view, the first dummy balls 541 may be disposed in an inner region, which is surrounded by the substrate connection terminals 550. When viewed in a plan view, the second dummy balls 542 may be disposed in an outer region, which is placed outside the substrate connection terminals 550. The second dummy balls 542 may vertically overlap the second semiconductor package 20. The dummy balls 540 may be arranged in the first and second direction D1 and D2, on the second substrate 300. The first dummy balls 541 may be arranged such that two adjacent ones of them are spaced apart from each other by a second distance d2. The second dummy balls 542 may be arranged such that two adjacent ones of them are spaced apart from each other by the second distance. The second distance d2 may be a distance between outer surfaces of two adjacent first dummy balls 541. The second distance d2 may be measured in the first direction D1. The second distance d2 of the first direction D1 may be the same as a second distance between two adjacent first dummy balls 541 that are arranged in the second direction D2. The present invention is not limited thereto. In some embodiments, the second distance d2 of the first direction D1 may be different from the second distance of the second direction D2. The first and second dummy balls 541 and 542 may have same distance of the second distance D2. The present invention is not limited thereto. In some embodiments, the second distance d2 of the first dummy balls 541 may be different from the second distance d2 of the second dummy balls 542. The second distance d2 may be equal to the first distance d1 between the substrate connection terminals 550. A third distance d3 between one of the first dummy balls 541 and one of the substrate connection terminals 550 that are adjacent to each other in the first direction D1 may be equal to one of the first distance d1 and the second distance d2. A fourth distance d4 between one of the second dummy balls 542 and one of the substrate connection terminals 550 that are adjacent to each other in the first direction D1 may be equal to one of the first distance d1 and the second distance d2. The third distance d3 may be equal to the fourth distance d4. In other words, the first dummy balls 541, the second dummy balls 542, and the substrate connection terminals 550 may be arranged with a uniform distance. The present invention is not limited thereto. In some embodiments, the second distance d2 may be different from the first distance d1. In some embodiments, the fourth distance d4 may be different from the third distance d3. In some embodiments, at least one of the first to fourth distances d1 to d4 may be different from the others.

The first dummy balls 541 may vertically overlap the first semiconductor chip 200. The second dummy balls 542 may not vertically overlap the first semiconductor chip 200. When viewed in a plan view, the second dummy balls 542 may surround the first semiconductor chip 200 and may be spaced apart from the perimeter of the first semiconductor chip 200.

Some of the dummy balls 540 may be provided on the second substrate 300 and may be spaced apart from the second interconnection pattern 321. Some of each of the dummy balls 540 may be in contact with the second interconnection pattern 321. The dummy balls 540 may be spaced apart from the third substrate 500. Top surfaces (i.e., uppermost ends) of the substrate connection terminals 550 may be located at a vertical level higher than top surfaces (i.e., uppermost ends) of the dummy balls 540, when measured the second substrate 300. For example, the top surfaces of the dummy balls 540 may be spaced apart from a bottom surface of the third substrate 500. The present invention is not limited thereto. In some embodiments, the dummy balls 540 may be in contact with the bottom surface of the third substrate 500, and a first contact area between each of the dummy balls 540 and the bottom surface of the third substrate 500, may be smaller than a second contact area between each of the substrate connection terminals 550 and the bottom surface of the third substrate 500.

According to an embodiment of the inventive concept, the dummy balls 540 may prevent or suppress a stress, which is exerted in an upward direction through the first semiconductor package 10 when the semiconductor package 1 is tested, from being concentrated on the substrate connection terminals 550. In other words, the dummy balls 540, which are disposed around the substrate connection terminals 550, may relieve a stress, which is exerted on the substrate connection terminals 550, and thus, it may be possible to improve structural stability of the semiconductor package.

In addition, the dummy balls 540 may be used as an emission path of heat, which is generated in the semiconductor chip. Thus, a semiconductor package with improved thermal stability may be provided.

Figure 3:
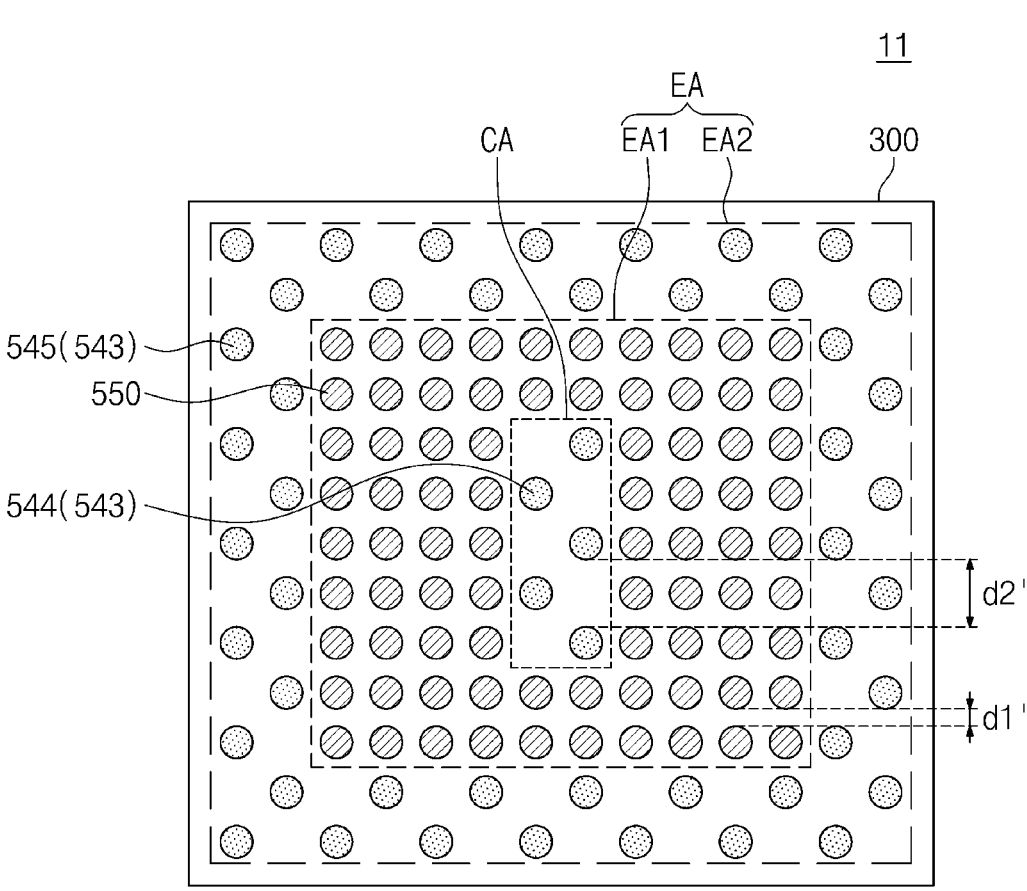
FIGS. 3 to 5 are plan views, each of which illustrates a semiconductor package according to an embodiment of the inventive concept.
Figure 3:
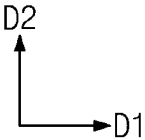

FIG. 3 is a plan view illustrating a semiconductor package according to an embodiment of the inventive concept. In the following description, an element previously described above may be identified by the same reference number without repeating an overlapping description thereof.

Referring to FIG. 3, a semiconductor package 11 may include components which are substantially the same as those of the semiconductor package 1 described with reference to FIG. 1. In the semiconductor package 11, dummy balls 543 may be arranged in a shape different from the substrate connection terminals 550, unlike the structure illustrated in FIG. 2. First dummy balls 544 may be arranged on the center region CA to form a zigzag shape in the second direction D2. Second dummy balls 545 may be arranged on the second edge region EA2 to form a zigzag shape in the first and second direction D1 and D2. A second distance d2', in the second direction D2, between two adjacent ones of the dummy balls 543 may be larger than a first distance d1', in the second direction D2, between two adjacent ones of the substrate connection terminals 550. A distance, in the second direction D1, between two adjacent ones of the dummy balls 543 may be the same as a distance, in the second direction D1, between two adjacent ones of the substrate connection terminals 550. The present invention is not limited thereto. In some embodiments, unlike the illustrated structure, the dummy balls 543 may be arranged in a shape different from the substrate connection terminals 550, and a first distance between two adjacent ones of the substrate connection terminals 550 may be larger than a second distance between two adjacent ones of the dummy balls 543.

Figure 4:
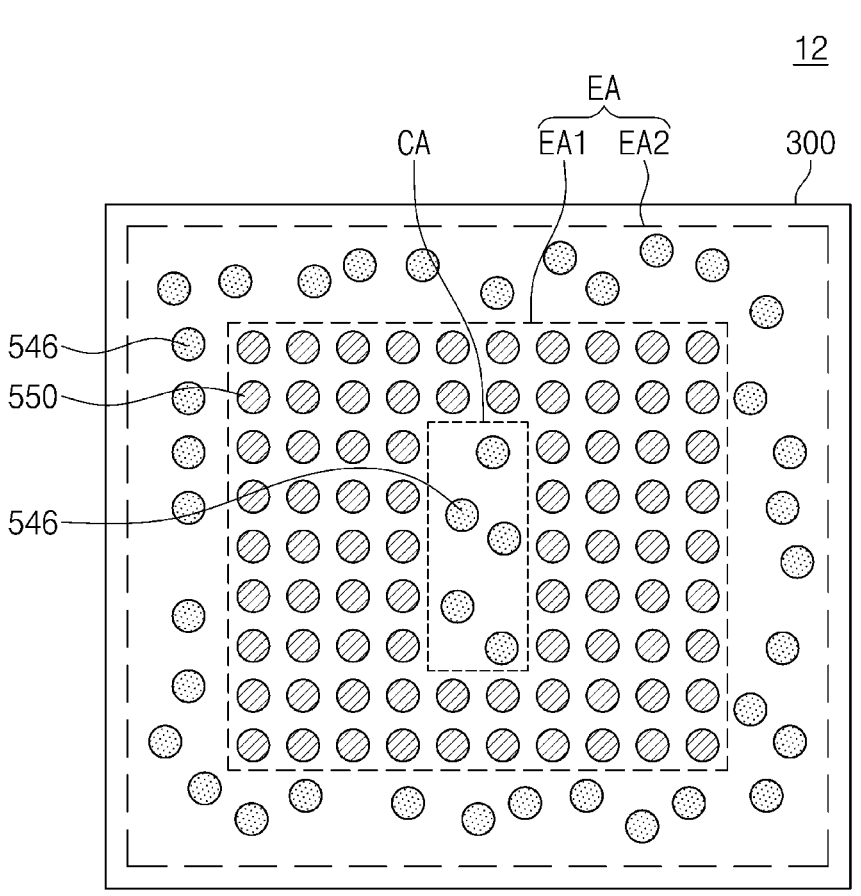
Figure 4:
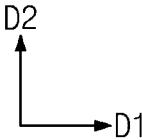

FIG. 4 is a plan view illustrating a semiconductor package according to an embodiment of the inventive concept. In the following description, an element previously described above may be identified by the same reference number without repeating an overlapping description thereof.

Referring to FIG. 4, a semiconductor package 12 may include components which are substantially the same as those of the semiconductor package 1 described with reference to FIG. 1. In the semiconductor package 12, dummy balls 546 may be arranged in a shape different from the substrate connection terminals 550, unlike the structure illustrated in FIG. 2. The dummy balls 546 may be irregularly provided on the center region CA and the second edge region EA2. The dummy balls 546 may be spaced apart from each other by various distances.

Figure 5:
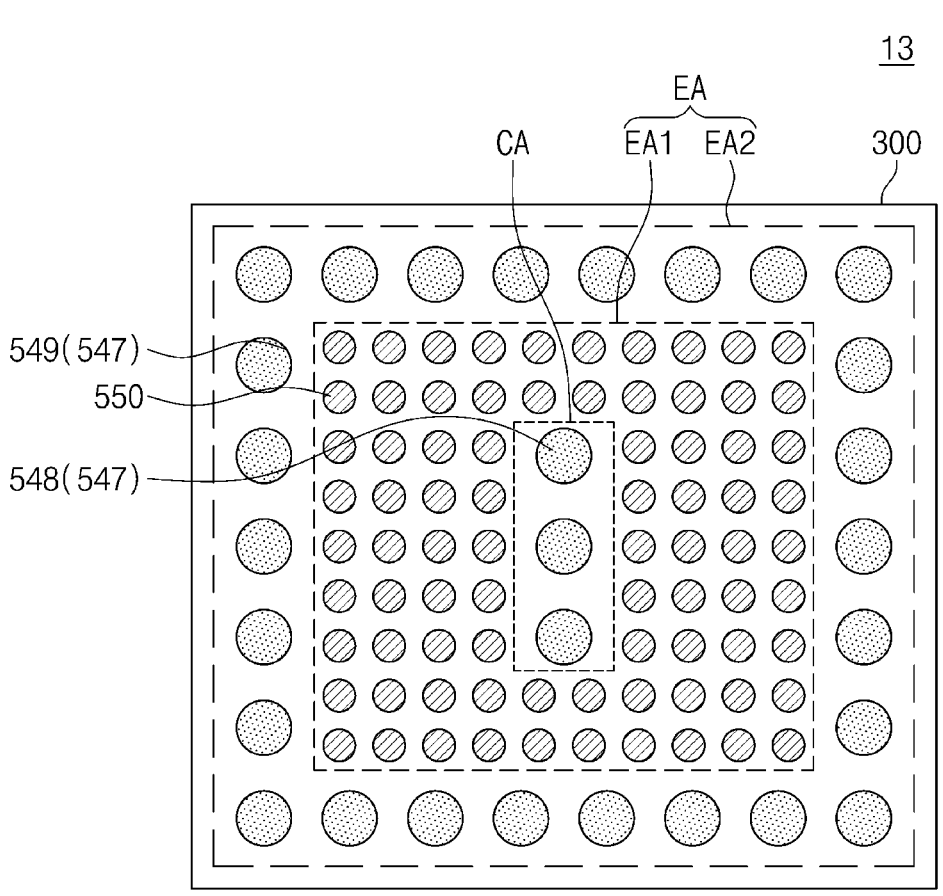
Figure 5:
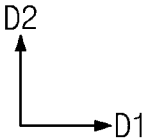

FIG. 5 is a plan view illustrating a semiconductor package according to an embodiment of the inventive concept. In the following description, an element previously described above may be identified by the same reference number without repeating an overlapping description thereof.

Referring to FIG. 5, a semiconductor package 13 may include components which are substantially the same as those of the semiconductor package 1 described with reference to FIG. 1. In the semiconductor package 13, a planar area of each of dummy balls 547 may be larger than a planar area of each of the substrate connection terminals 550, unlike the structure illustrated in FIG. 2. However, the inventive concept is not limited to this example, and the planar area of each of the dummy balls 547 may be smaller than the planar area of each of the substrate connection terminals 550. In addition, when viewed in a plan view, the dummy balls 547 and the substrate connection terminals 550 may have a circular shape, as shown in FIG. 5, but may be changed if necessary. For example, the dummy balls 547 and the substrate connection terminals 550 may have an elliptical or polygonal shape, when viewed in a plan view.

Figure 6:
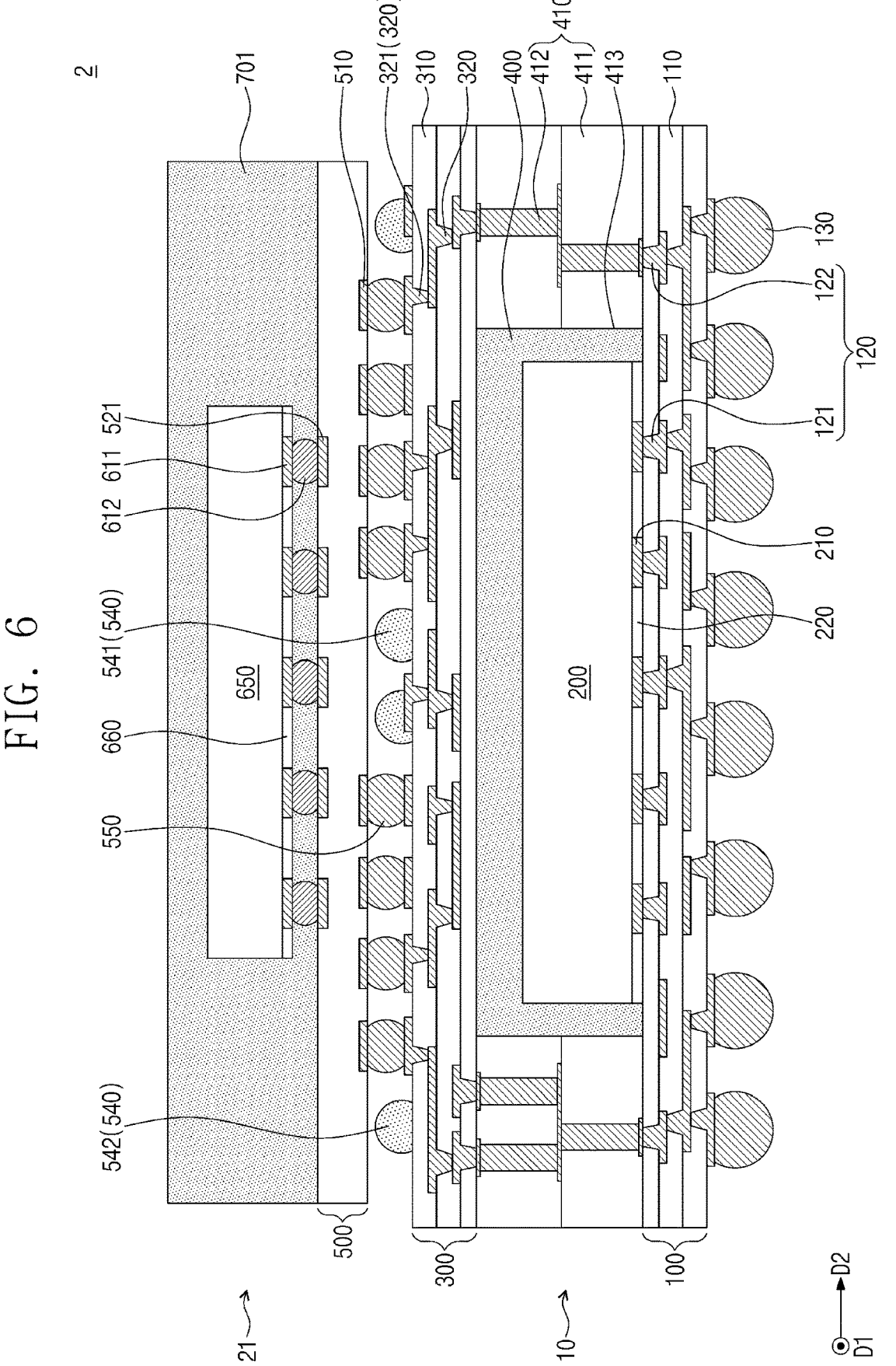
FIGS. 6 to 9 are sectional views, each of which illustrates a semiconductor package according to an embodiment of the inventive concept.

FIG. 6 is a sectional view illustrating a semiconductor package according to an embodiment of the inventive concept. In the following description, an element previously described above may be identified by the same reference number without repeating an overlapping description thereof.

Referring to FIG. 6, a semiconductor package 2 may include a second semiconductor package 21, in which a second semiconductor chip 650 is mounted on the third substrate 500 in a flip chip manner, unlike the semiconductor package 1 of FIG. 1. In detail, the second semiconductor chip 650 may include a second chip pad 611 disposed on a bottom surface thereof. The second chip pad 611 may be electrically connected to an integrated circuit, which is formed in the second semiconductor chip 650. The second chip pad 611 may be exposed to the outside of the second semiconductor chip 650, near a bottom surface of the second semiconductor chip 650. The second chip pads 611 may include or may be formed of a conductive material. For example, the second chip pads 611 may be formed of or include copper (Cu).

A second chip passivation layer 660 may be provided on the bottom surface of the second semiconductor chip 650. The second chip passivation layer 660 may enclose the second chip pads 611. The second chip passivation layer 660 may expose a bottom surface of the second chip pads 611. A bottom surface of the second chip passivation layer 660 may be coplanar with the bottom surface of the second chip pads 611. The second chip passivation layer 660 may be formed of or include at least one of insulating materials (e.g., silicon oxide (SiO), silicon nitride (SiN), or silicon carbon nitride (SiCN)).

Second chip connection terminals 612 may be provided between the third substrate 500 and the second semiconductor chip 650. The second chip connection terminals 612 may be coupled to first substrate pads 521 and the second chip pads 611. Accordingly, the second chip connection terminals 612 may electrically connect the third substrate 500 to the second semiconductor chip 650.

A second mold layer 701 may be provided on the third substrate 500. The second mold layer 701 may cover the top surface of the third substrate 500 and may enclose the second semiconductor chip 650. The second mold layer 701 may enclose the second chip connection terminals 612, between the third substrate 500 and the second semiconductor chip 650.

Figure 7:
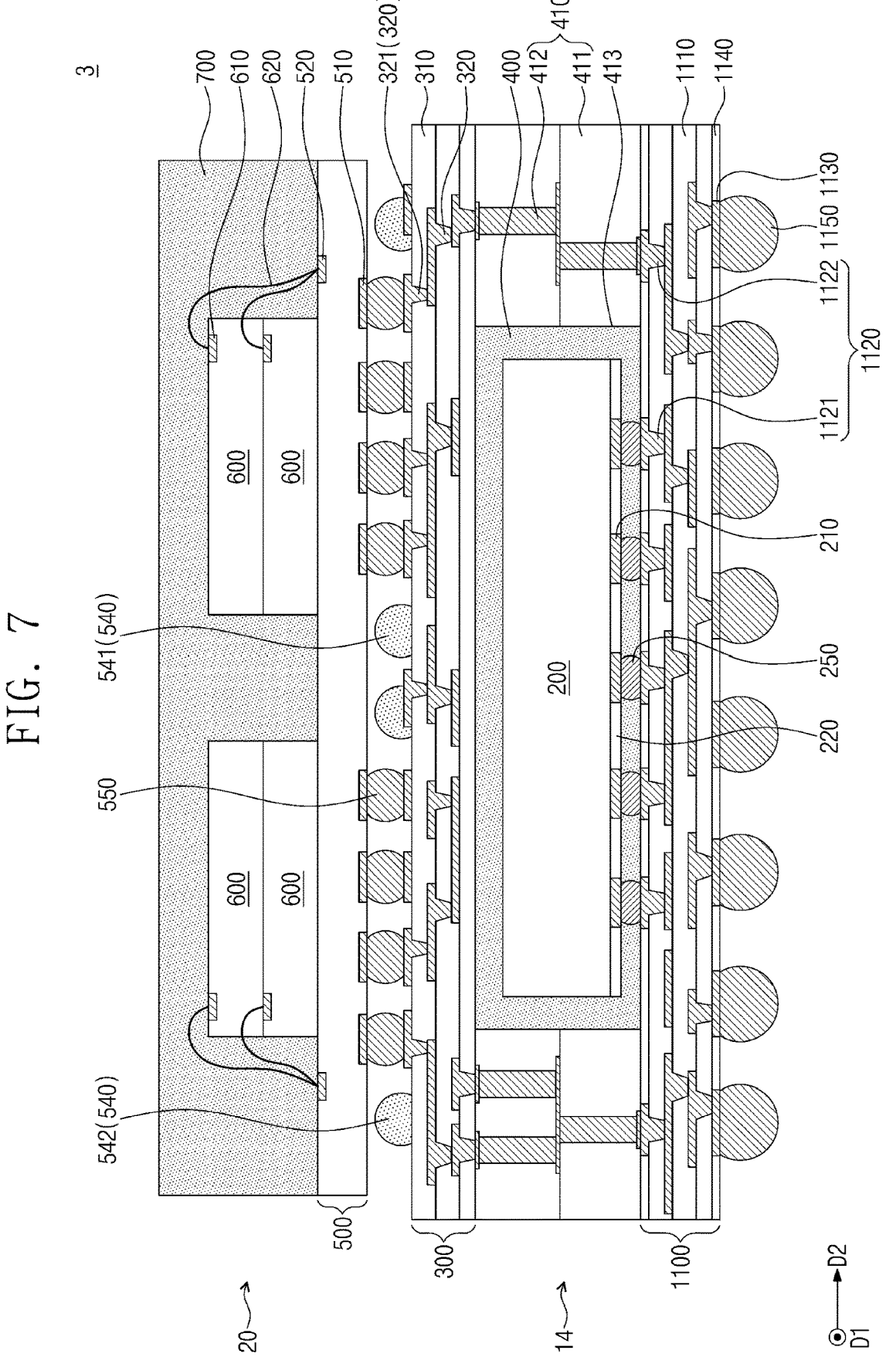

FIG. 7 is a sectional view illustrating a semiconductor package according to an embodiment of the inventive concept. In the following description, an element previously described above may be identified by the same reference number without repeating an overlapping description thereof.

Referring to FIG. 7, a semiconductor package 3 may differ from the semiconductor package 1 of FIG. 1 in a structure of a first substrate 1100 and a mounting method of the first semiconductor chip 200 and the connection substrate 410.

The first substrate 1100 may be a redistribution substrate. The redistribution substrate may include first insulating layers 1110 and first interconnection patterns 1120 in the first insulating layers 1110. Alternatively, the first substrate 1100 may include a printed circuit board, which includes interconnection patterns printed on top and bottom surfaces thereof. The following description will be given based on the embodiment of FIG. 7.

The first substrate 1100 may include a plurality of first insulating layers 1110, which are sequentially stacked. In the illustrated structure, three first insulating layers 1110 may be provided in the first substrate 1100, but the number of the first insulating layers 1110 may be variously changed, if necessary. The first insulating layers 1110 may be formed of or include the same material as the first insulating layers 110 described with reference to FIG. 1.

The first interconnection pattern 1120 may be provided in the first insulating layers 1110. The first interconnection pattern 1120 may have a first via portion and a first wire portion, which are connected to form a single object. The first wire portion may be provided in the first substrate 1100 and may be an interconnection pattern used for a horizontal interconnection. The first via portion may be provided in the first insulating layer 1110 and may be an interconnection pattern used for a vertical interconnection. The first via portion may connect the first interconnection pattern 1120 to one another, which is vertically adjacent thereto, in a vertical direction. The first wire portion may be provided on and connected to the first via portion, without any interface therebetween. Each of the first interconnection patterns 1120 may have a T-shaped section. The first wire portion of the first interconnection pattern 1120 may be placed on a top surface of the first insulating layer 1110. The first via portion of the first interconnection pattern 1120 may penetrate the first insulating layers 1110 and may be coupled to the first wire portion of an underlying one of the first interconnection patterns 1120. The first interconnection patterns 1120 may include or may be formed of a conductive material. For example, the first interconnection patterns 1120 may be formed of or include copper (Cu). Although not shown, seed patterns may be further provided to cover bottom surface of the first interconnection patterns 1120. The seed patterns may be formed of or include a material different from the first interconnection patterns 1120. The seed patterns may serve as a barrier layer preventing a material in the first interconnection patterns 1120 from being diffused. The seed patterns may include or may be formed of a conductive material. For example, the seed patterns may be formed of or include at least one of copper (Cu), titanium (Ti), gold (Au), silver (Ag), and an alloy thereof.

The uppermost ones of the first interconnection patterns 1120 may be exposed to the outside of the first substrate 1100, near a top surface of the first substrate 1100. The first interconnection patterns 1120 may include patterns 1122 connected to the conductive patterns 412 of the connection substrate 410. The first interconnection patterns 1120 may further include patterns 1121 that are used as pads, on which the first semiconductor chip 200 will be mounted.

Substrate pads 1130 may be provided on a bottom surface of the lowermost one of the first insulating layers 1110 of the first substrate 1100. The substrate pads 1130 may be connected to the first interconnection pattern 1120. The substrate pads 1130 may include or may be formed of a conductive material. As an example, the substrate pads 1130 may be formed of or include copper (Cu).

A substrate protection layer 1140 may be provided on a bottom surface of the lowermost one of the first insulating layers 1110. The substrate protection layer 1140 may be provided to enclose the substrate pads 1130 but may expose bottom surfaces of the substrate pads 1130.

Outer connection terminals 1150 may be provided on a bottom surface of the first substrate 1100. The outer connection terminals 1150 may be formed on bottom surfaces of the substrate pads 1130. The outer connection terminals 1150 may include or may be solder balls or solder bumps. For example, the outer connection terminals 1150 may be formed of or include at least one of, for example, tin (Sn), bismuth (Bi), lead (Pb), silver (Ag), and an alloy thereof.

The first semiconductor chip 200 may be provided on the first substrate 1100. The first semiconductor chip 200 may be mounted on the first substrate 100 through a chip connection terminal 250. In detail, the chip connection terminal 250 may be provided between the first substrate 1100 and the first semiconductor chip 200. The chip connection terminal 250 may be coupled to the patterns 1121 of the first interconnection pattern 1120 and the first chip pad 210. The chip connection terminal 250 may be enclosed by the first mold layer 400.

Figure 8:
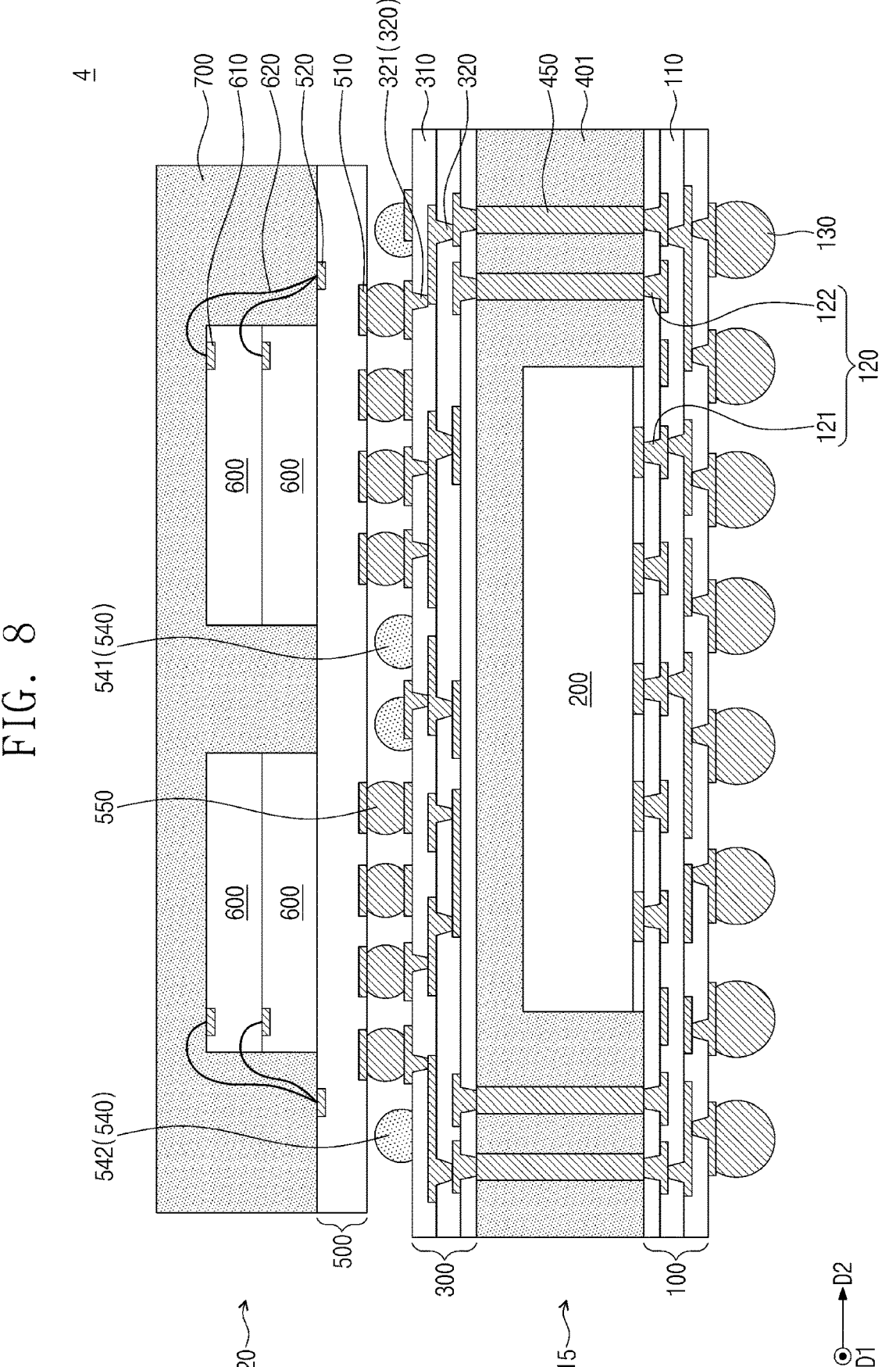

FIG. 8 is a sectional view illustrating a semiconductor package according to an embodiment of the inventive concept. In the following description, an element previously described above may be identified by the same reference number without repeating an overlapping description thereof.

Referring to FIG. 8, a semiconductor package 4 may include a first semiconductor package 15, in which a penetration electrode 450 connecting the first substrate 100 to the second substrate 300 is provided. The connection substrate 410 of the semiconductor package 1 of FIG. 1 may not be present in the semiconductor package 4. In detail, the penetration electrode 450 may be provided on the first interconnection pattern 122, which is exposed to the outside of the first substrate 100. The penetration electrode 450 may be spaced apart from a side surface of the first semiconductor chip 200 and may surround the first semiconductor chip 200. A top surface of the penetration electrode 450 may be in contact with the second interconnection pattern 320, which is exposed to the outside of the second substrate 300 near the bottom surface of the second substrate 300. The penetration electrode 450 may serve as a connection structure connecting the first substrate 100 to the second substrate 300. The penetration electrode 450 may include or may be formed of a conductive material. For example, the penetration electrode 450 may be formed of or include copper (Cu) or tungsten (W).

A first mold layer 401 may be provided on the first substrate 100. The first mold layer 401 may cover the top surface of the first substrate 100 and may enclose the first semiconductor chip 200 and the penetration electrode 450. A side surface of the first mold layer 401 may be vertically aligned to a side surface of the first substrate 100. A top surface of the first mold layer 401 may be coplanar with the top surface of the penetration electrode 450. The first mold layer 401 may be formed of or include at least one of insulating polymers (e.g., epoxy-based molding compounds).

Figure 9:
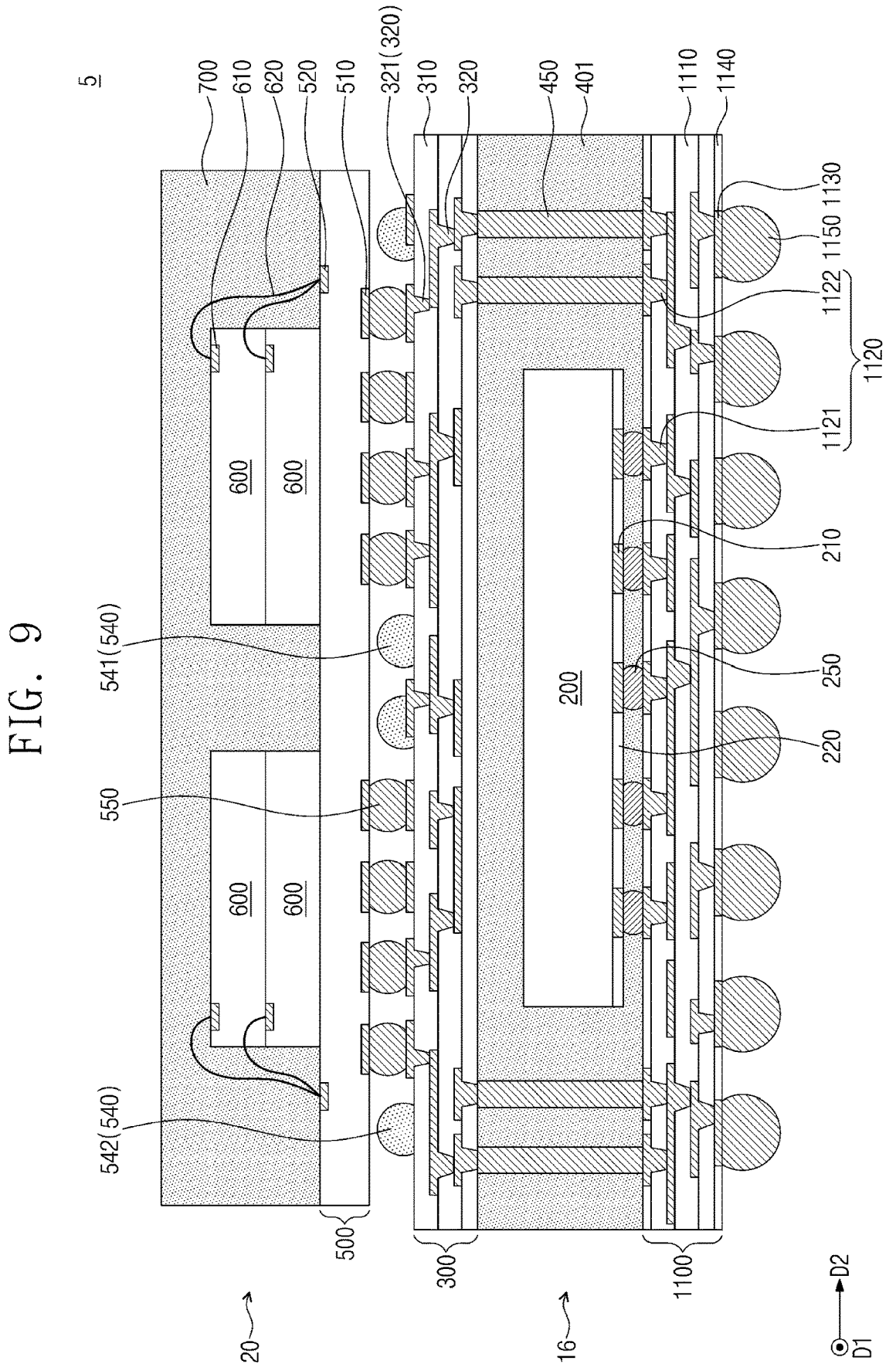

FIG. 9 is a sectional view illustrating a semiconductor package according to an embodiment of the inventive concept. In the following description, an element previously described above may be identified by the same reference number without repeating an overlapping description thereof.

Referring to FIG. 9, a semiconductor package 5 may include a first semiconductor package 16, which differs from the semiconductor package 4 described with reference to FIG. 8 in the structure of the first substrate 1100 and a mounting method of the first semiconductor chip 200. In detail, a structure of the first substrate 1100 of the first semiconductor package 16 and a method of mounting the first semiconductor chip 200 may be substantially the same as those in the embodiment described with reference to FIG. 7.

According to an embodiment of the inventive concept, not only connection terminals, which are used to electrically connect a plurality of stacked semiconductor packages to each other, but also dummy balls, which are arranged around the connection terminals, may be provided between semiconductor packages. The dummy balls may reduce a stress, which is concentrated on the connection terminals when a test process is performed on the semiconductor packages. Thus, it may be possible to improve structural stability of the semiconductor package. In addition, the dummy balls may be used as a heat-dissipation path for dissipating heat generated in a semiconductor chip, and thus, it may be possible to improve thermal stability of the semiconductor package.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
   a first package including a first substrate, a first semiconductor chip mounted on the first substrate, and a second substrate on the first semiconductor chip, the first package having a center region, a first edge region surrounding the center region, and a second edge region surrounding the first edge region, when viewed in a plan view;

a plurality of dummy balls disposed on the center region and the second edge region of the first package;

a plurality of substrate connection terminals disposed on the first edge region of the first package; and a second package including a third substrate, which is disposed on the plurality of dummy balls and the plurality of substrate connection terminals, and a second semiconductor chip, which is mounted on the third substrate, wherein the plurality of dummy balls are in contact with the second substrate and are spaced apart from the third substrate, and wherein the plurality of substrate connection terminals are coupled to the second substrate and the third substrate.

2. The semiconductor package of claim 1, wherein top surfaces of the plurality of substrate connection terminals are located at a level higher than top surfaces of the plurality of dummy balls, when measured from the second substrate.

3. The semiconductor package of claim 1, wherein the plurality of dummy balls comprise:

a plurality of first dummy balls on the center region; and a plurality of second dummy balls on the second edge region, wherein the plurality of first dummy balls vertically overlap the first semiconductor chip, and wherein the plurality of second dummy balls are spaced apart from the first semiconductor chip, when viewed in a plan view.

4. The semiconductor package of claim 1, wherein a first distance between two adjacent ones of the plurality of substrate connection terminals is equal to a second distance between two adjacent ones of the plurality of dummy balls.

5. The semiconductor package of claim 4, wherein a third distance between a first substrate connection terminal of the plurality of substrate connection terminals and a first dummy ball of the plurality of dummy balls is equal to the first distance, and wherein the first substrate connection terminal is adjacent to the first dummy ball.

6. The semiconductor package of claim 1, wherein widths of the plurality of dummy balls decrease as a distance to the third substrate decreases.

7. The semiconductor package of claim 1, wherein the plurality of substrate connection terminals electrically connect the first semiconductor chip to the second semiconductor chip.

8. The semiconductor package of claim 1, wherein the first semiconductor chip comprises a logic chip, and wherein the second semiconductor chip comprises a memory chip.

9. A semiconductor package, comprising:

a first substrate;

a first semiconductor chip mounted on the first substrate;

a second substrate disposed on the first semiconductor chip;

a connection structure spaced apart from the first semiconductor chip and connecting the first substrate to the second substrate;

a third substrate disposed on the second substrate; and a second semiconductor chip mounted on the third substrate, wherein the second substrate comprises:

a first region, on which a plurality of substrate connection terminals connecting the second substrate to the third substrate are provided;

a second region surrounded by the first region and provided with a plurality of first dummy balls; and a third region surrounding the first region and provided with a plurality of second dummy balls, and wherein a first contact area between the third substrate and each of the plurality of first and second dummy balls is smaller than a second contact area between the third substrate and each of the plurality of substrate connection terminals.

10. The semiconductor package of claim 9, wherein the plurality of first and second dummy balls are in contact with the second substrate and are spaced apart from the third substrate, and wherein the plurality of substrate connection terminals are in contact with the second substrate and the third substrate.

11. The semiconductor package of claim 9, wherein widths of the plurality of first and second dummy balls decrease as a distance to the third substrate decreases.

12. The semiconductor package of claim 9, wherein the plurality of second dummy balls vertically overlap the third substrate.

13. The semiconductor package of claim 9, wherein the plurality of first dummy balls vertically overlap the first semiconductor chip, and wherein the plurality of second dummy balls are spaced apart from the first semiconductor chip, when viewed in a plan view.

14. The semiconductor package of claim 9, wherein a first distance between two adjacent ones of the plurality of substrate connection terminals is equal to a second distance between two adjacent ones of the plurality of first and second dummy balls.

15. The semiconductor package of claim 14, wherein a third distance between one of the plurality of substrate connection terminals and one of the plurality of first and second dummy balls is equal to the first distance, and wherein the one of the plurality of substrate connection terminals is adjacent to the one of the plurality of first and second dummy balls.

16. The semiconductor package of claim 9, wherein the plurality of substrate connection terminals electrically connect the first semiconductor chip to the second semiconductor chip.

17. The semiconductor package of claim 9, wherein the first semiconductor chip comprises a logic chip, and wherein the second semiconductor chip comprises a memory chip.

18. A semiconductor package, comprising:

a first package having a center region, a first edge region surrounding the center region, and a second edge region surrounding the first edge region, when viewed in a plan view;

a plurality of dummy balls disposed on the center region and the second edge region of the first package;

a plurality of substrate connection terminals disposed on the first edge region of the first package; and a second package on the plurality of dummy balls and the plurality of substrate connection terminals, wherein the first package comprises:

a first substrate;

a first semiconductor chip mounted on the first substrate;

a second substrate on the first semiconductor chip;

a connection structure spaced apart from the first semiconductor chip and connecting the first substrate to the second substrate; and a first mold layer provided between the first and second substrates and enclosing the first semiconductor chip and the connection structure, wherein the second package comprises:

a third substrate;

a second semiconductor chip wire-bonded to the third substrate; and a second mold layer enclosing the second semiconductor chip on the third substrate, wherein the plurality of substrate connection terminals connect the second substrate to the third substrate, and wherein a first contact area between the third substrate and each of the plurality of dummy balls is smaller than a second contact area between the third substrate and each of the plurality of substrate connection terminals.

19. The semiconductor package of claim 18, wherein the plurality of dummy balls are connected to the second substrate and are spaced apart from the third substrate.

20. The semiconductor package of claim 18, wherein the plurality of dummy balls comprise:

a plurality of first dummy balls on the center region; and a plurality of second dummy balls on the second edge region, wherein the plurality of first dummy balls vertically overlap the first semiconductor chip, and wherein the plurality of second dummy balls are provided to surround the first semiconductor chip and are spaced apart from the first semiconductor chip, when viewed in a plan view.

* * * * *